(12) United States Patent
Bruce et al.

(10) Patent No.: US 6,539,321 B2
(45) Date of Patent: Mar. 25, 2003

(54) METHOD FOR EDGE BIAS CORRECTION OF TOPOGRAPHY-INDUCED LINEWIDTH VARIATION

(75) Inventors: James A. Bruce, Williston, VT (US); Orest Bula, Shelburne, VT (US); Edward W. Conrad, Jeffersonville, VT (US); William C. Leipold, Enosburg Falls, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/906,919

(22) Filed: Jul. 17, 2001

(65) Prior Publication Data

US 2003/0018443 A1 Jan. 23, 2003

(51) Int. Cl.$^7$ ............................................... G06F 19/00
(52) U.S. Cl. ......................................... 702/97; 702/170
(58) Field of Search .................... 324/716; 364/489; 430/5, 16, 30, 69, 156, 165, 252, 270.1, 310, 312, 313, 316, 325, 780; 700/121; 702/97, 137, 155, 166, 167, 170; 716/4, 5, 9, 19, 21; 216/59, 84

(56) References Cited

U.S. PATENT DOCUMENTS

| | | | | |
|---|---|---|---|---|
| 5,196,087 A | * | 3/1993 | Kerns | 156/626 |
| 5,740,068 A | * | 4/1998 | Liebmann et al. | 364/489 |
| 5,893,050 A | * | 4/1999 | Park et al. | 702/97 |
| 5,916,716 A | * | 6/1999 | Butsch et al. | 430/30 |
| 5,985,498 A | * | 11/1999 | Levison et al. | 430/30 |
| 6,268,293 B1 | * | 7/2001 | Clevenger et al. | 438/706 |
| 6,370,441 B1 | * | 4/2002 | Ohnuma | 700/121 |

OTHER PUBLICATIONS

Wong, A K; Ferguson, R A; Mansfield, S M; "The Mask Error Factor In Optical Lithography"; IEEE Transactions on Semiconductor Manufacturing; vol. 13 Issue 2; 2000; pp 235–242.*

* cited by examiner

Primary Examiner—John Barlow
Assistant Examiner—Douglas N Washburn
(74) Attorney, Agent, or Firm—Scully, Scott, Murphy & Presser; Richard M. Kotulak, Esq.

(57) ABSTRACT

Method for effecting edge bias correction of topography-induced linewidth variations which are encountered in printed or integrated circuits on substrates or semiconductor devices for electronic packages. The method modifies data for current levels which is predicated on prior level data and models, as to the manner in which topography will affect the resist and/or antireflective coating (ARC) thicknesses, so as to improve upon linewidth (LW) control and, in general, imparting improved processing windows. The method can be implemented in the form of computer-executable instructions which are embodied in one or more program modules stored on computer-usable media.

62 Claims, 4 Drawing Sheets

METHOD FOR EDGE BIAS CORRECTION OF TOPOGRAPHY-INDUCED LINEWIDTH VARIATION

BACKGROUND OF THE INVENTION

1. Field of the Invention

The present invention relates to methods for effecting edge bias correction of topography-induced linewidth variations which are encountered in printed or integrated circuits on substrates or semiconductor devices for electronic packages.

In essence, during the formation of printed or integrated circuits there may be encountered undesirable topography-induced linewidth (LW) variations in view of the aspect that prior patterning levels can conceivably create topography which causes (photo) resist and/or antireflective coating (ARC) thickness variations in the level which is being currently implemented. In effect, these variations and diverse thicknesses may lead to linewidth (LW) variations in the printed circuits due to thin film interference (TFI) effects.

2. Discussion of the Prior Art

Although the technology has addressed itself to deriving different solutions which are designed for effectuating the reducing of topography-induced linewidth (LW) variations, these concepts have not always proven themselves to be entirely practical or economical in their applications in attempts to optimize LW controls.

a) Thus, for instance, efforts have been expended to reduce topography-induced LW variations by attempting to reduce and/or eliminate the topography. This, theoretically would be ideal, but frequently is impractical or even impossible to physically implement with currently available technology.

b) Furthermore, certain processing enhancements may also be employed such as:
   i) the use of thicker ARC's which reduce the thin film interference (TFI) but which cause more problems in implementing the etching. Consequently, there is encountered a tradeoff in etch variations for TFI reductions, which is of a somewhat impractical value in nature;
   ii) employ top ARC's, which add process costs and complexity, limit material choices, but which may still provide some undue linewidth (LW) variations.
   iii) implement thickness optimization; however, in the event that the topography is large enough, then it becomes difficult to optimize. Moreover, even with optimization of the thickness this may cause some undue linewidth (LW) variations.

The present invention, in essence, is intended to solve the problems that are encountered in the current state-of-the technology, wherein prior patterning levels in the formation of printed circuits can create topographies which cause resist and antireflective coating (ARC) thickness variations in current photoresist application levels; whereby, in turn, these thickness variations lead to undesirable linewidth (LW) variations due to encountered thin film interference (TFI) effects.

SUMMARY OF THE INVENTION

Accordingly, in order to clearly and unambiguously improve upon and possibly eliminate the limitations and drawbacks which are encountered in the current state-of-the technology, the invention modifies data for current levels which is predicated on prior level data and models, as to the manner in which topography will affect the resist and antireflective coating (ARC) thicknesses, so as to improve upon linewidth (LW) control and, in general, imparting improved processing windows.

Pursuant to the invention, the data for the current level design data is modified to compensate for the effects of prior level topography, whereby the data modification consists of shifting edges of shapes in the data set. The amount of the shift is determined according to width or area of underlying pattern regions, or according to underlying pattern density.

Furthermore, in accordance with the invention the method for improving upon linewidth control may be implemented as computer-executable instructions which may be embodied in a program module or module stored on computer-useable media. A suitable computer program or collection of programs may be employed to implement the method in a variety of programming structures in data forms predicated on the information contained in the present specification.

Accordingly, it is an object of the present invention to improve upon topography-induced variations in linewidth (LW) in the formation of printed circuits by the expedients of modifying data for current levels based upon prior level data and models, as to the manner in which topography will affect resist and ARC thicknesses.

Another object of the invention is to provide a novel method of improved linewidth control and improved processing windows by employing data modification for the current level predicated on prior level data and models of topography affecting resist and ARC thicknesses.

Yet another object of the present invention is to provide for a method for edge bias correction of topography-induced printed circuit linewidth variations through the intermediary of modifying current level design data to compensate for the effects caused by prior level interference (TFI) effects in view of the creation of a topography leading to resist and antireflective coating (ARC) thickness variations.

Still another object of the present invention resides in the provision of a computer program or a collection of programs adapted to implement the inventive method in the form of computer-executable instructions, which may be tangibly embodied in a program module or module stored on computer-useable media.

BRIEF DESCRIPTION OF THE ACCOMPANYING DRAWINGS

The foregoing and other objects of the invention may now be more readily ascertained from the following detailed description of preferred embodiments of the invention, taken in conjunction with the accompanying drawings; in which.

DETAILED DESCRIPTION OF PREFERRED EMBODIMENTS

Basically, any even relatively slight changes in the resist or ARC thicknesses can resultingly cause significant variations or changes to take place in the linewidth (LW) of the printed circuitry due to thin film interference (TFI) effects. On a planar surface, it is possible to be able to optimize the resist and ARC thickness in order to minimize TFI-induced linewidth (LW) variations. However, when there is a topography present on the surface of the wafer, there will of necessity be encountered some local variations in the resist and/or ARC thicknesses. Even relatively shallow step heights in the topography are significant, inasmuch as the TFI quarter wave is relatively small; for instance approx. 37 nm for a 248 nm exposure and 29 nm for a 193 nm exposure, by way of example. The planarization of a resist or antireflective coating (ARC) film over a step in the surface readily leads to variations in the resist or ARC thicknesses. However, since these variations in thickness are systematic, it is potentially possible to predict their effects on linewidths (LW) and thus to be able to compensate for the effects of the topography. For example, as the resist coating which is being applied to the surface planarizes a step, the resist thickness will decrease over the extent of the step. This, in turn, will produce either a decrease or increase in the linewidth (LW) depending upon the relative location of the nominal thickness within the so called swing curve. Nevertheless, this change in the linewidth (LW) can be compensated for by appropriately changing the design data so as to achieve the desired control over the precision in the production thereof.

Figure 1:
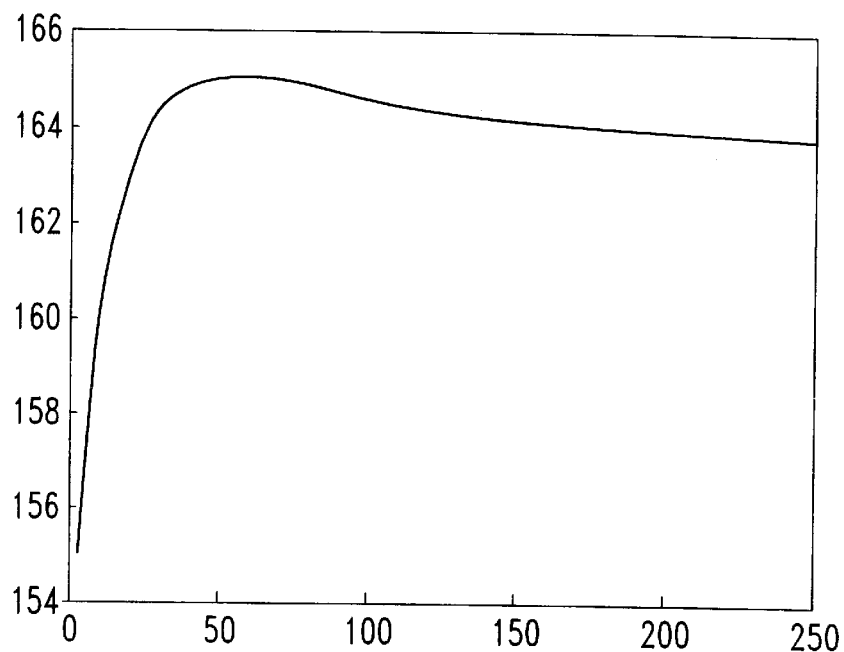
FIG. 1 illustrates a graphical representation of linewidth (LW) plotted versus topography width.
Figure 2:
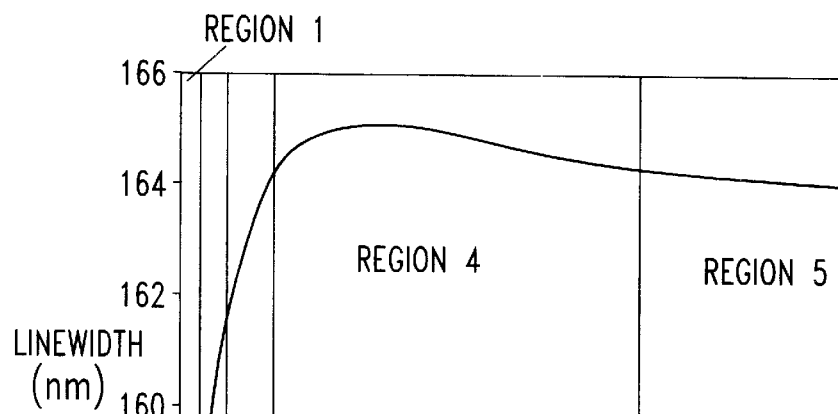
FIG. 2 illustrates a graphical representation of linewidth (LW) versus topography width as divided into a various regions along the topography of a surface provided with printed circuits.
Figure 3:
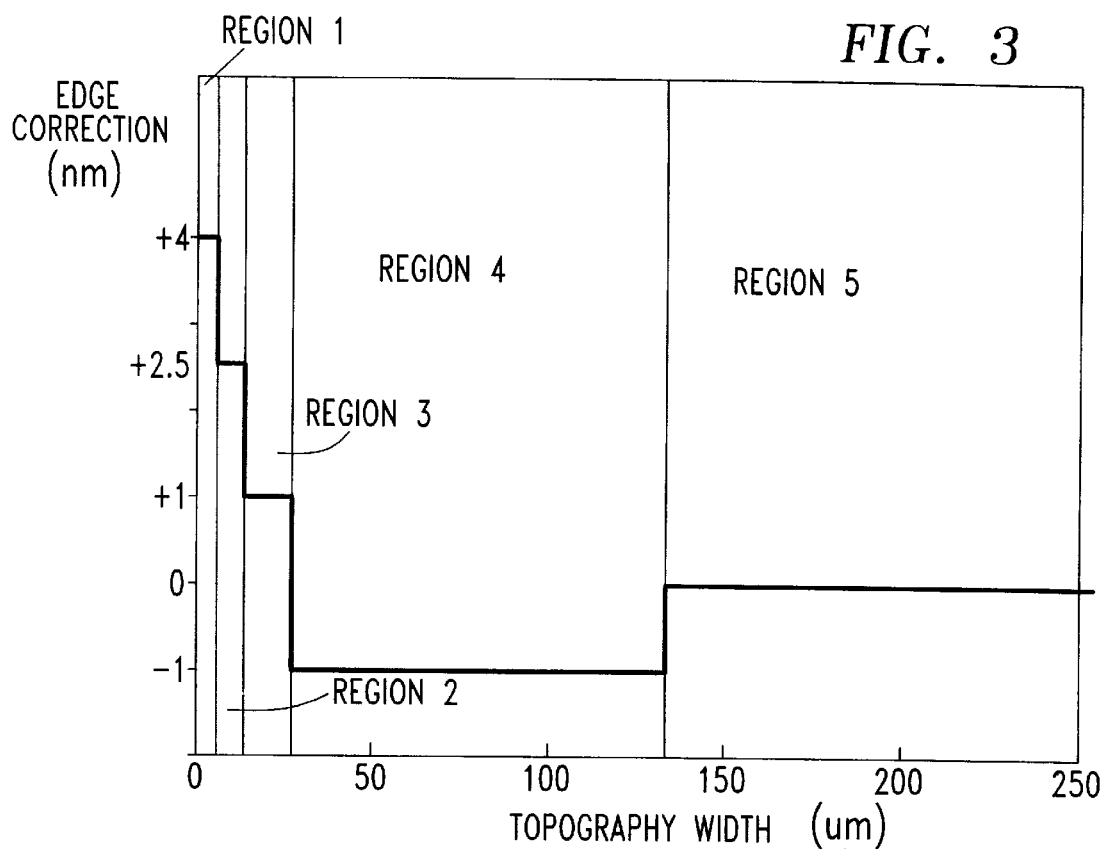
FIG. 3 illustrates a graphical representation of edge correction versus topography width across various regions over the extent of the topography.

Referring now in detail to the invention, and with reference to the accompanying drawings; a first example of a method employing a one-time calibration of data in order to achieve the inventive bias correction of topography-induced linewidth (LW) variations of a printed circuit comprises essentially the following steps:

1. One time calibration:
   a) Determine the effect of width of topography on resist and ARC thicknesses (through simulation or experimentally). This can conceivably be an equation relating resist (and/or ARC) thickness to width of the topography, or Table 1 (as set forth hereinbelow) containing width, ARC, and resist thickness values. Equations 1 and 2 as follows, each illustrate show experimentally determined empirical fits for AR3-ARC and UV110 resist as a function of step height, h, width, W, antireflective coating ARC, and resist RES; wherein:

$$ARC = (ARC_{nom} - h) + (1 + e^{(-0.8 \times W0.55)}) \times h \quad \text{Equation 1}$$

$$RES = (RES_{nom} - h) + (1 + (25 \times W^{29})e^{(-5.5 \times W0.3)}) \times h \quad \text{Equation 2}$$

b) Determine effect of resist and ARC thickness variations on LW (simulation or experimental data) (i.e. Table with resist thickness, ARC thickness, and LW as the columns).
   c) Combine a) and b) in order to obtain a correlation of topography width and LW; i.e. Table with width of topography and LW as the columns, or a graphical plot, as shown in FIG. 1 of the drawings.
   d) Define Regions 1 through 5 by creating "buckets" vs topography width such as topography width less than 7 um=Region 1; 7 um to 14 um=Region 2; etc., as illustrated in FIG. 2 of the drawings.
   e) Assign an edge correction value to each region by comparing average LW in each region to the desired LW. For example, when observed LW in Region 1 (from parts c and d above) is 170 nm and desired LW is 160 nm, then a −5 nm per edge correction value is assigned to Region 1. This is illustrated in the graphical plot of FIG. 3. The value of the correction may not match the value of the error due to non-linearity.

2. Break initial data set into regions (1 to 5) based on width of the underlying shape.
3. Apply an edge correction to each shape based on the region (1 to 5) into which it falls.

Figure 4:
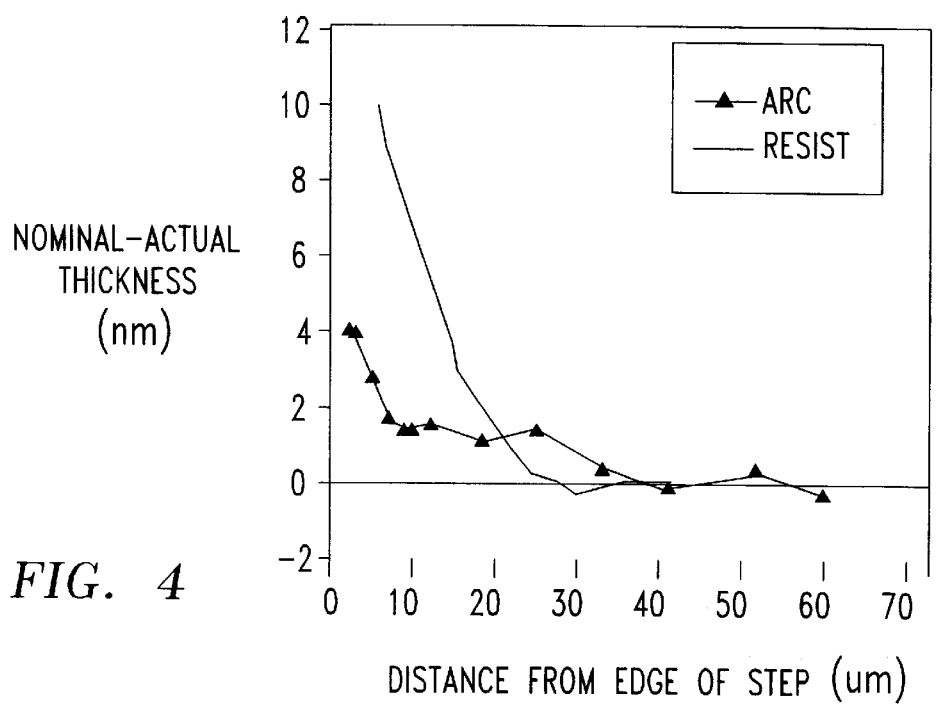
FIG. 4 illustrates a graphical representation of the nominal to actual thicknesses plotted versus distance from the edge of a step for experimentally determined data for ARC and resist thickness as a function of distance from the edge of the topography feature.
Figure 5:
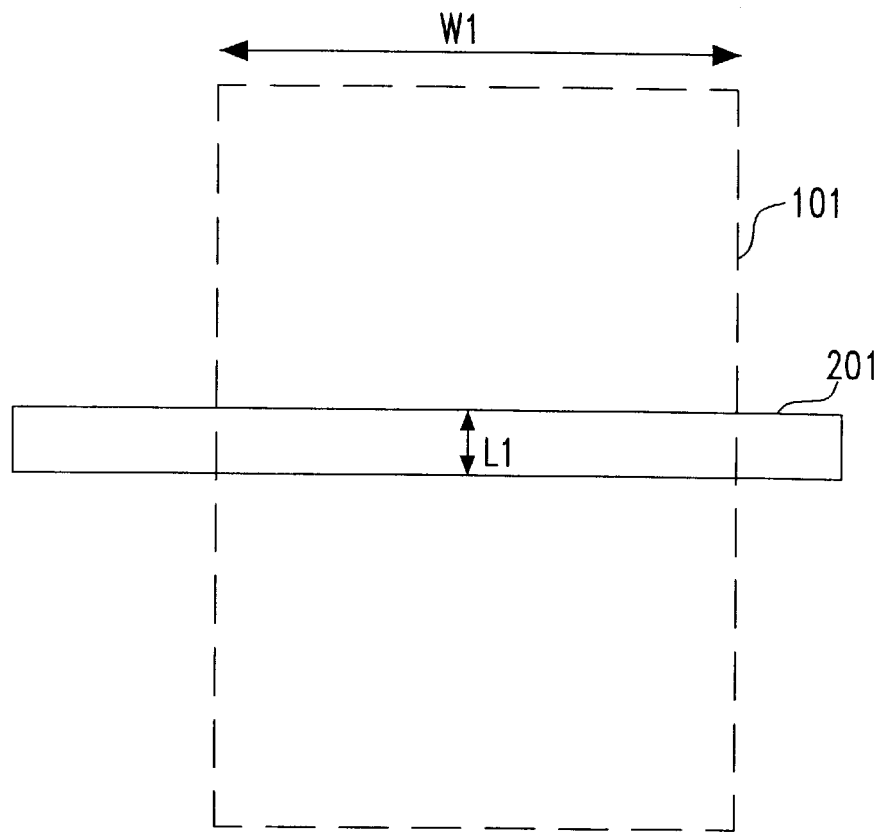
FIG. 5 illustrates a breakdown of the initial data set into regions of the topography based on the width of the underlying shape.
Figure 6:
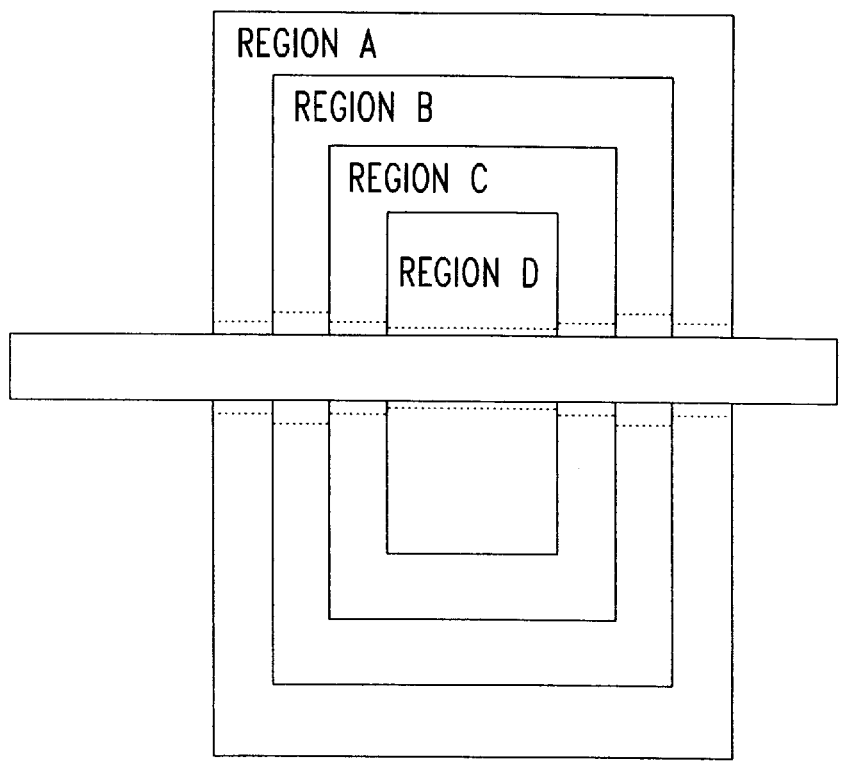
FIG. 6 illustrates a more specific embodiment of the topography divided into four Regions A through D.

An alternative exemplary method of determining the effect of width of topography resist and ARC thickness it may be also determined as follows:

1. One time calibration:
   a) Determine effect of width of topography on resist and ARC thicknesses (simulation or experimental). This could be an equation relating resist and (ARC) thickness to the width of the topography, or the Table containing width, ARC and resist thickness values. Equations 1 and 2, as listed hereinabove, show experimentally determined empirical fits for AR3-ARC and UV110 resist as a function of step height h, and width W; etc.
   b) Determine effect of distance from the edge of a step on resist and ARC thickness (simulation or experimental). This could be an equation relating resist and (ARC) thickness to distance from the edge of a step, or a table containing width, ARC and resist thickness values. FIG. 4 and Table 1 shows experimentally determined data for ARC and resist thickness as a function of distance from an edge of a topography feature;
   c) Determine effect of resist and ARC thickness variations on LW (simulation or experimental data) (i.e. Table with resist thickness, ARC thickness and LW listed as the columns);
   d) Combine a), b) and c) to obtain a correlation of topography width, distance from an edge and LW (i.e. look up Table with topography width along one axis, distance from an edge on the other axis, and the cells of the Table containing the predicted LW.
   e) Define regions by creating so called "buckets" vs. topography width and vs. distance from an edge e.g. Topography width of less than 0.3 um=Region 1; any region less than 0.1 um from the edge of structure which is between 0.3 and 0.5 um wide=Region 2;
   f) Assign an edge correction value to each region by comparing average LW in each region to the desired LW;

2. Break initial data set into regions based on width of underlying shape as represented in FIGS. 5 and 6. FIG. 5 shows a topographic feature (101), and a feature crossing over it (201). In FIG. 6 the topographic feature is divided into 4 regions.
3. Apply an edge correction to each shape based on the region it falls in. This is illustrated in FIG. 6 with the dashed or phantom lines representing the changes required to feature 201.

It is also possible to provide alternatives to the foregoing for specific applications, such as follows:

It may be possible to account for CMP systematic variations (e.g. for large pads dish, then substrate film thicknesses will vary. Input substrate and/or resist/ARC thicknesses, determine predicated effect on LW, and corrections may be applied accordingly).

Account for etch effects (e.g. with RIE (reactive ion etch) lag the step height could change as a function of width. This data could be included in the correction tables).

Apply corrections to account for resist variation only (e.g. for a conformal ARC).

Apply corrections to account for ARC variation only.

Account for local pattern density of underlying level, to account for more global topography effects. (e.g. divide data into grids, determine pattern density of topography in a given grid, correlate pattern density to average resist/ARC thickness, and then apply corrections to tables).

Apply corrections based upon area of topography features (and possibly also with regard to width).

Apply corrections to account for reflective notching, e.g. at a distance of "x" from a topography edge apply an edge bias "y" to the current level for a length of "z". This correction could be further refined to also be a function of the width or spacing of the topography features. (e.g. the slope at the edge of the topography could alter the location of reflected light, and the topography slope might be a function of width or spacing).

The following is the tabular representation as mentioned hereinabove:

TABLE 1

| Distance From edge | ARC D | Resist D |
|---|---|---|
| 2 | 4.1 | 12 |
| 4 | 3.0 | 10 |
| 6 | 2 | 8.8 |
| 8 | 1.4 | 7.3 |
| 10 | 1.3 | 5.8 |
| 12 | 1.25 | 5.1 |
| 14 | 1.2 | 3.2 |
| 16 | 1.15 | 2.6 |
| 18 | 1.1 | 1.8 |
| 20 | 1.05 | 1 |
| 22 | 1 | 0.4 |
| 24 | 0.9 | 0.2 |
| 26 | 0.7 | 0 |
| 28 | 0.5 | 0 |
| 30 | 0.3 | 0 |
| 32 | 0 | 0 |

Pursuant to a preferred embodiment, the invention can also be implemented as computer-executable instructions which when executed perform the steps of the method as described hereinabove. The instructions are tangibly embodied in a program module or modules stored on computer-usable media.

Figure 7:
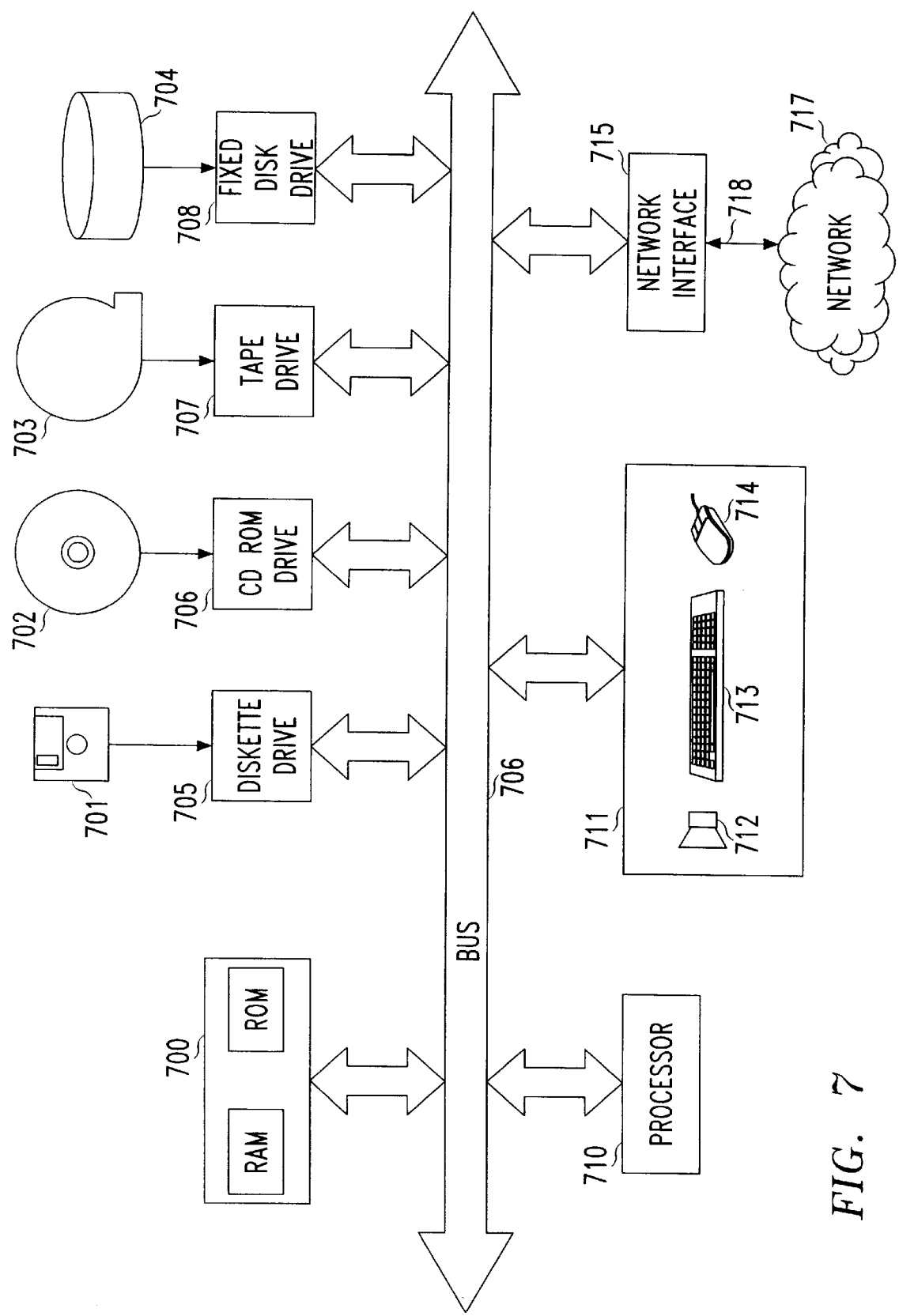
FIG. 7 illustrates a generally diagrammatic representation of a computer system for implementing the invention in the form of computer-executable instructions.

Referring to FIG. 7, this shows a high-level representation of a general purpose computer system for implementing the invention in the form of computer-executable instructions, such as might be realized by a variety of known and commercially available hardware and software elements. The system comprises a memory 700 including a ROM and RAM, processor 710 and user interface 711 comprising a video display 712, keyboard 713 and mouse 714, whereby the various operative elements may communicate via system bus 706. The system may further be connected to a network 717 via a network medium 718 and network interface 715.

A computer program or a collection of programs comprising computer-executable instructions for performing method steps according to the present invention may be stored and transported on computer-usable media such as diskette 701, CD-ROM 702, magnetic tape 703 and fixed disk 704.

In order to perform the steps of the method, the instructions may be retrieved from the computer-usable media 701–704 using their respective drives 705–708 into memory 700 and executed by a processor 710. The method discloses hereinabove may find specific implementations in a variety of programming structure and data forms, which are considered to be within the abilities of a programmer of ordinary skill in the art after having reviewed the specification.

From the foregoing it becomes readily apparent that the inventive methods for the edge bias correction of topography-induced linewidth (LW) variations are each of a simple nature and may be readily implemented without undue difficulty and with a high degree of precision and accuracy.

While the invention has been particularly shown and described with respect to preferred embodiments thereof, it will be understood by those skilled in the art that the foregoing and other changes in form and details may be made therein without departing from the spirit and scope of the invention.

What is claimed is:

1. A method for reducing linewidth variations of printed circuits through the provision of a current level design data set which is modified to compensate for the effects of prior level topography on the linewidths, said method comprising the steps of:

a) breaking the current level data set into predetermined regions of said topography each based on the width of an underlying shape; and b) applying an edge correction to each said shape based on the region into which it falls, wherein said edge correction is derived from a source for mapping the effects of the width of topography on a film coating utilized in processing the printed circuits in comparison with the effect of the film coating on the linewidth.

2. A method as claimed in claim 1, wherein said mapping source for the effects of the width of topography comprises a tabular derivation of said edge correction.

3. A method as claimed in claim 1, wherein said mapping source for the effects of the width of topography comprises an equation or formula representing said edge correction.

4. A method as claimed in claim 1, wherein said data modification comprises shifting edges of shape in said data set.

5. A method as claimed in claim 4, wherein shifting is effected by an amount according to the width or area of respective underlying pattern regions or density of said topography.

6. A method as claimed in claim 1, wherein there is implemented a one-time calibration, comprising the steps of:

1) determining the effect of width topography on resist and antireflective coating thicknesses;

2) determining the effect of film coating thickness variations on linewidths;

3) combining steps 1) and 2) in order to obtain an correlation of topography width and linewidths;

4) defining a plurality of regions by creating a plurality of topography widths;

5) assigning an edge correction value to each said region by comparing the average linewidth in each region with the desired linewidth;

6) breaking the initial data set into said plurality of regions based on width of the underlying shape; and 7) applying an edge correction to each shape based on the region into which it falls.

7. A method as claimed in claim 1, wherein said film coating comprises a resist material.

8. A method as claimed in claim 1, wherein said film coating comprises an antireflective coating material.

9. A method as claimed in claim 1, wherein said film coating comprises a resist and an antireflective coating material.

10. A method as claimed in claim 7, wherein said resist method comprises a UV110 composition.

11. A method as claimed in claim 8, wherein said antireflective coating comprises a AR3 composition.

12. A method as claimed in claim 1, wherein there is implemented a one-time calibration, comprising the steps of:
   1) determining the effect of width of topography on film coating thicknesses;
   2) determining the effect of distance from the edge of a step in the topography on film coating thicknesses;
   3) determining the effect of film coating thickness variations on linewidths;
   4) combining steps 1), 2) and 3) to obtain a correlation of topography width, distance from and edge and linewidth along one axis and the distance from and edge on another axis, and data containing a predicted linewidth;
   5) defining regions of topography width and distance from an edge;
   6) assigning an edge correction value to each region by comparing an average linewidth in each region to a desired linwidth;
   7) breaking the initial data set into regions based on width of the underlying shape; and
   8) applying an edge correction to each shape based on the region into which it falls.

13. A method as claimed in claim 12, wherein said coating comprises a resist material.

14. A method as claimed in claim 12, wherein said film coating comprises an antireflective coating material.

15. A method as claimed in claim 12, wherein said film coating comprises a resist and an antireflective coating material.

16. A method as claimed in claim 13, wherein said resist material comprises a UV110 composition.

17. A method as claimed in claim 14, wherein said antireflective coating comprises an AR3 composition.

18. A method as claimed in claim 1, for varying substrate film thicknesses, determining predicated effect on linewidths, and effecting said corrections.

19. A method as claimed in claim 1, wherein for lag in etch effects such as reactive ion etch, a step height is changed as a function of width in effectuating corrections.

20. A method as claimed in claim 7, wherein corrections are applied to account for resist variation only.

21. A method as claimed in claim 8, wherein corrections are applied to account for antireflective coating variations only.

22. A method as claimed in claim 1, including the steps of accounting for local pattern density of an underlying level so as to account for more global topography effects by dividing data into grids, determining pattern density of topography in a given grid, correlating pattern density to average film thicknesses, and then applying corrections.

23. A method as claimed in claim 1, wherein corrections are applied based upon area of topography features and selectively with regard to width.

24. A method as claimed in claim 1, wherein corrections are applied to account for reflective notching.

25. A method as claimed in claim 12, for varying substrate film thicknesses, determining predicated effect on linewidths, and effecting correlative corrections.

26. A method as claimed in claim 12, wherein for lag in etch effects such as reactive ion etch, the step height is changed as a function of width in effectuating corrections.

27. A method as claimed in claim 13, wherein corrections are applied to account for resist variation only.

28. A method as claimed in claim 14, wherein corrections are applied to account for antireflective coating variations only.

29. A method as claimed in claim 12, including the steps of a accounting for local pattern density of an underlying level so as to account for more global topography effects by dividing data into grids, determining pattern density of topography in a given grid, correlating pattern density to average film thickness, and then applying corrections.

30. A method as claimed in claim 12, wherein corrections are applied based upon area of topography features and selectively with regard to width.

31. A method as claimed in claim 12, wherein corrections are applied to account for reflective notching.

32. A computer program system readable by a machine tangibly employing a program of instructions executable by the machine to perform a method for reducing reducing linewidth variations of printed circuits through the provision of a current level design data set which is modified to compensate for the effects of prior level topography on the linewidths, said method comprising the steps of:
   a) breaking the current level data set into predetermined regions of said topography each based on the width of an underlying shape; and
   b) applying an edge correction to each said shape based on the region into which it falls, wherein said edge correction is derived from a source for mapping the effects of the width of topography on a film coating utilized in processing the printed circuits in comparison with the effect of the film coating on the linewidth.

33. The computer program system as claimed in claim 32, wherein said mapping source for the effects of the width of topography comprises a tabular derivation of said edge correction.

34. The computer program system as claimed in claim 32, wherein said mapping source for the effects of the width of topography comprises an equation or formula representing said edge correction.

35. The computer program system as claimed in claim 32, wherein said data modifications comprises shifting edges of shape in said data set.

36. The computer program system as claimed in claim 35, wherein shifting is effected by an amount according to the width or area of respective underlying pattern regions or density of said topography.

37. The computer program system as claimed in claim 32, wherein there is implemented a one-time calibration, comprising the steps of:
   1) determining the effect of width of topography on film coating thicknesses;
   2) determining the effect of distance from the edge of a step in the topography on film coating thicknesses;
   3) determining the effect of film coating thickness variations on linewidths;
   4) combining steps 1), 2) and 3) to obtain a correlation of topography width, distance from and edge and linewidth along one axis and the distance from and edge on another axis, and data containing a predicted linewidth;

5) defining regions of topography width and distance from an edge;

6) assigning an edge correction value to each region by comparing an average linewidth in each region to a desired linewidth;

7) breaking the initial data set into regions based on width of the underlying shape; and 8) applying an edge correction to each shape based on the region into which it falls.

38. The computer program system as claimed in claim 32, wherein said film coating comprises a resist material.

39. The computer program system as claimed in claim 32, wherein said film coating comprises an antireflective coating material.

40. The computer program system as claimed in claim 32, wherein said film coating comprises a resist and an antireflective coating material.

41. The computer program system as claimed in claim 38, wherein said resist method comprises a UV110 composition.

42. The computer program system as claimed in claim 39, wherein said antireflective coating comprises a AR3 composition.

43. The computer program system as claimed in claim 32, where there is implemented a one-time calibration, comprising the steps of:

1) determining the effect of width of topography on film coating thicknesses;

2) determining the effect of distance from the edge of a step in the topography on film coating thicknesses;

3) determining the effect of film coating thickness variations on linewidths;

4) combining steps 1), 2) and 3) to obtain a correlation of topography width, distance from and edge and linewidth along one axis and the distance from and edge on another axis, and data containing a predicted linewidth;

5) defining regions of topography width and distance from an edge;

6) assigning an edge correction value to each region by comparing an average linewidth in each region to a desired linewidth;

7) breaking the initial data set into regions based on width of the underlying shape; and 8) applying an edge correction to each shape based on the region into which it falls.

44. The computer program system as claimed in claim 43, wherein said coating comprises a resist material.

45. The computer program system as claimed in claim 43, wherein said film coating comprises an antireflective coating material.

46. The computer program system as claimed in claim 43, wherein said film coating comprises a resist and an antireflective coating material.

47. The computer program system as claimed in claim 44, wherein said resist material comprises a UV110 composition.

48. The computer program system as claimed in claim 45, wherein said antireflective coating comprises an AR3 composition.

49. The computer program system as claimed in claim 32, for varying substrate film thicknesses, determining predicted effect on linewidths, and effecting said corrections.

50. The computer program system as claimed in claim 32, wherein for lag in etch effects such as reactive ion etch, a step height is changed as a function of width in effectuating corrections.

51. The computer program system as claimed in claim 38, wherein corrections are applied to account for resist variations only.

52. The computer program system as claimed in claim 39, wherein corrections are applied to account for antireflective coating variations only.

53. The computer program system as claimed in claim 32, including the steps of accounting for local pattern density of an underlying level so as to account form more global topography effects by dividing data into grids, determining pattern density of topography in a given grid, correlating pattern density to average film thicknesses, and they applying corrections.

54. The computer program system as claimed in claim 32, wherein corrections are applied based upon are of topography features and selectively with regard to width.

55. The computer program system as claimed in claim 32, wherein corrections are applied to account for reflective notching.

56. The computer program system as claimed in claim 43, for varying substrate film thicknesses, determining predicated effect on linewidths, and effecting correlative corrections.

57. The computer program system as claimed in claim 43, wherein for lag in etch effects such as reactive ion etch, the step height is changed as a function of width in effectuating corrections.

58. The computer program system as claimed in claim 44, wherein corrections are applied to account for resist variation only.

59. The computer program system as claimed in claim 37, wherein corrections are applied to account for antireflective coating variations only.

60. The computer program system as claimed in claim 43, including the steps of a accounting for local pattern density of an underlying level so as to account for more global topography effects by dividing data into grids, determining pattern density of topography in a given grid, correlating pattern density to average film thickness, and then applying corrections.

61. The computer program system as claimed in claim 43, wherein corrections are applied based upon area of topography features and selectively with regard to width.

62. The computer program system as claimed in claim 43, wherein corrections are applied to account for reflective notching.

* * * * *